United States Patent
Fricke et al.

(10) Patent No.: US 10,348,056 B2
(45) Date of Patent: Jul. 9, 2019

(54) LASER DIODE WITH DISTRIBUTED FEEDBACK AND METHOD FOR PRODUCING

(71) Applicant: FORSCHUNGSVERBUND BERLIN E.V., Berlin (DE)

(72) Inventors: Jörg Fricke, Berlin (DE); Götz Erbert, Löbau (DE); Paul Crump, Berlin (DE); Jonathan Decker, Berlin (DE)

(73) Assignee: FORSCHUNGSVERBUND BERLIN E.V., Berlin (DE)

( * ) Notice: Subject to any disclaimer, the term of this patent is extended or adjusted under 35 U.S.C. 154(b) by 0 days.

(21) Appl. No.: 15/736,631

(22) PCT Filed: Mar. 9, 2016

(86) PCT No.: PCT/EP2016/055019
§ 371 (c)(1),
(2) Date: Dec. 14, 2017

(87) PCT Pub. No.: WO2017/001062
PCT Pub. Date: Jan. 5, 2017

(65) Prior Publication Data
US 2018/0145481 A1     May 24, 2018

(30) Foreign Application Priority Data
Jun. 30, 2015   (DE) .................. 10 2015 110 515

(51) Int. Cl.
*H01S 5/12*   (2006.01)
*H01S 5/20*   (2006.01)
*H01S 5/026*  (2006.01)

(52) U.S. Cl.
CPC ............ *H01S 5/1225* (2013.01); *H01S 5/026* (2013.01); *H01S 5/1221* (2013.01); *H01S 5/1231* (2013.01); *H01S 5/2086* (2013.01)

(58) Field of Classification Search
CPC ..... H01S 5/1225; H01S 5/1231; H01S 5/2086
See application file for complete search history.

(56) References Cited

U.S. PATENT DOCUMENTS

| 5,659,562 A * | 8/1997 | Hisa ........................ H01S 5/12 372/50.11 |
| 6,577,660 B1 * | 6/2003 | Muroya .................. B82Y 20/00 372/45.01 |
| 2005/0030997 A1 * | 2/2005 | Tanaka ................... B82Y 20/00 372/46.01 |

FOREIGN PATENT DOCUMENTS

JP        H10 223967 A       8/1998

OTHER PUBLICATIONS

English Translation of International Search Report dated May 4, 2016, dated May 12, 2016.
(Continued)

*Primary Examiner* — Michael Carter
(74) *Attorney, Agent, or Firm* — Norris McLaughlin, P.A.

(57) ABSTRACT

Laser diode comprises an active layer; a waveguiding region at least partially surrounding the active layer; a rear facet; a front facet designed for outcoupling laser radiation, wherein the active layer extends at least partially along a first axis (X) between the rear facet and the front facet; and a grating operatively connected to the waveguiding region, wherein the grating comprises a plurality of bridges and trenches designed such that an average increase of a coupling parameter P for the plurality of trenches along the grating is non-zero, wherein the coupling parameter P of a trench is defined by the equation, wherein $d_{res}$ is a distance of the trench to the active layer, w is a width of the trench and $\Delta n$ is the refractive index difference between a refractive index of the trench and a refractive index of a material surrounding the trench.

20 Claims, 11 Drawing Sheets

(56) References Cited

OTHER PUBLICATIONS

International Search Report dated May 4, 2016, dated May 12, 2016.

* cited by examiner a)

b)

LASER DIODE WITH DISTRIBUTED FEEDBACK AND METHOD FOR PRODUCING

This application is the U.S. National Stage of International Application No. PCT/EP2016/055019, filed Mar. 9, 2016, which claims foreign priority benefit under 35 U.S.C. § 119 of German Application No. 10 2015 110 515.2 filed Jun. 30, 2015.

The invention relates to a laser diode with distributed feedback and a method for producing. In particular, the present invention relates to a laser diode and a method for producing in which the distributed feedback occurs via a surface grating of high order while radiation is decoupled preferably on one side and in which the coupling strength of the grating is adapted to the power density of the wave guided in the laser diode.

TECHNOLOGICAL BACKGROUND OF THE INVENTION

Laser diodes with distributed feedback (also referred to as distributed feedback or DFB laser diodes) are monolithic constructed frequency stabilized laser light sources. In contrast to diode lasers with an external cavity or DBR (Distributed Bragg Reflector) laser diodes, in laser diodes with distributed feedback, the frequency-selective element is monolithically connected to the laser resonator and already interacts with it during radiation generation. The frequency-selective element is usually a Bragg grating in the immediate vicinity of the active layer, which is designed as a surface grating and which interacts directly with the radiation field generated.

The main advantage of laser diodes with distributed feedback is their monolithic construction, by which a compact and stable diode laser structure can be realized. Improvements in design and in material quality have led to immense progress in the implementation of such diode laser concepts in recent years, with the result that optical output powers well above one watt can now be realized in the field of high-power laser diodes by the use of broadarea laser diodes.

In order to achieve the narrowest possible laser emission, a strong interaction of the grating with the optical field is necessary. However, such a strongly interacting grating reduces the efficiency of the outcoupling and increases the optical losses within the resonator. Therefore, a high output power and a high electro-optical conversion efficiency generally oppose a narrow linewidth of the laser diode. The strength of the grating interaction must therefore be adapted very precisely to the laser field in order to achieve an optimum between the two parameters.

In the design of laser diodes with distributed feedback, the influence of the grating must be kept as low as possible, since even a small increase in the electrical resistance of the current path or the occurring optical absorption can often lead to a collapse of the laser performance. Furthermore, the use of gratings of a high order (N≥10) is advantageous since this reduces the requirements for processing, in particular for lithography.

However, in the production of laser diodes with distributed feedback based on such high-order gratings, the allowable manufacturing tolerances for the necessary grating depth generation are extremely small. In addition, it is advantageous if, in the area of high optical power density, the influence of the gratings is reduced in order to reduce the losses in the resonator and to counteract any occurring saturation effects, for example the longitudinal hole burning.

For narrow-band laser diodes comes as another criterion the locking range, which is achievable in operation. The locking range indicates how far apart the grating's Bragg wavelength and the gain maximum of the active layer can be apart without increasing the spectral linewidth (95% power confinement). This distance is also called detuning ($\Delta\lambda_{det}$). A tuning of the locking range is usually done via the temperature of the laser diode. In prior art (Crump et al., J. Phys. D: Appl. Phys. 46 (2013) 013001; Decker et al., IEEE Photon Technol. Lett. 27 (2015) 1675) laser diodes with distributed feedback with uniform gratings for the ratio between optical output line and operating current at room temperature, electro-optical power increases S of 0.9 W/A are typically measured. There, for example, line widths under 1 nm (±2σ range) have been successfully demonstrated in a thermal tuning window of up to 35 K ($\Delta\lambda_{det}\approx 10$ nm). In the case of uniform gratings, however, the parameter ranges are generally already completely exhausted and largely optimized, so that a further improvement of the thermal tuning behavior can only be achieved at the expense of the conversion efficiency or outcoupling efficiency of the laser diode.

The invention is therefore based on the object to provide a laser diode with distributed feedback, in which one or more of the described problems of the prior art can be avoided or at least significantly reduced. In particular, a laser diode and a method for the production are to be provided, in which the distributed feedback occurs via a surface grating of high order while radiation is outcoupled preferably on one side and in which the coupling strength of the grating is adapted to the power density of the guided wave in the laser diode.

SUMMARY OF THE INVENTION

The stated object is achieved by a laser diode according to claim 1. Therefore, the laser diode comprises an active layer; a waveguiding region at least partially surrounding the active layer; a rear facet; a front facet designed for outcoupling laser radiation, wherein the active layer extends at least partially along a first axis between the rear facet and the front facet; and a grating operatively connected to the waveguiding region, wherein the grating comprises a plurality of ridges and trenches. The invention is characterized in that the plurality of trenches is designed such that an average increase of a coupling parameter P for the plurality of trenches along the grating is non-zero. Here, the coupling parameter P of a trench is defined by the equation $$P = \frac{\Delta n}{w d_{res}},$$

wherein $d_{res}$ is a distance of the trench to the active layer, w is a width of the trench and $\Delta n=|n-n_M|$ is the refractive index difference (also referred to as refractive index contrast) between the refractive index n of the trench and the refractive index $n_M$ of a material surrounding the trench. The distance between the trench and the active layer is the minimum distance between the side of the respective trench facing the active layer and the side of the active layer facing this trench.

The introduced coupling parameter serves as a distinguishing and ordering feature for the strength of the interaction of the grating with a wave guided parallel to the first axis in the waveguiding region. The coupling parameter therefore describes a generalized general relationship between the properties of a grating and the strength of the interaction with a wave, without, however, referring to the specific physical properties of the wave.

In a further aspect of this invention, the laser diode comprises an active layer; a waveguiding region at least partially surrounding the active layer; a rear facet; a front facet designed for outcoupling laser radiation, wherein the active layer extends at least partially along a first axis between the rear facet and the front facet; and a grating operatively connected to the waveguiding region, wherein the grating comprises a plurality of ridges and trenches. The invention is characterized in that the plurality of trenches is designed such that an average increase of a coupling parameter P for the plurality of trenches is non-zero, wherein the coupling parameter P of a trench is defined by the equation P=w·d·n wherein d is a depth of the trench or a distance of the trench to the active layer, w is a width of the trench and n is a refractive index of the trench. This is an alternative definition of a coupling parameter P. The values resulting from the different definitions can be converted into each other.

The definition of a coupling parameter P does not represent a generally valid measurement specification. This is rather intended to enable a comparability of the coupling strength of individual trenches within a common grating arrangement. Therefore, the average definition used or the respective definition of a depth, width and refractive index measure can differ in practical terms between different gratings; within a single grating structure, however, a clear definition must be made. For determining the individual parameters (depths or distances, width and refractive index or refractive index contrast of a trench of the grating) and the average increase of the coupling parameter, preferably the arithmetic average is used. This is particularly important if the walls of the trenches, for example by a stepwise anisotropic etching process, have different edge profiles. For a clear determination of the individual parameter values, the necessity of a corresponding averaging becomes obvious.

The gratings are essentially two types or regimes, due to their dimensions. Gratings etched from the semiconductor surface by parts of the waveguide structure typically have a relatively large refractive index difference Δn to the surrounding waveguiding region and are referred to as surface gratings. In such gratings, the physical grating strength, that is the actual strength of the interaction between the grating and the wave guided in the waveguiding region, typically determined by the total reflectance R of the grating structure (Decker et al., IEEE Photon., Technology Lett., 27 (2015) 1675). By using the total reflectance R, it is considered in surface gratings that the vertical mode in the etched areas is deformed so much that the coupling in the longitudinal direction is not decoupled from the mode profile. The reflectance R therefore needs to be calculated by elaborate numerical methods (e.g., mode matching). In contrast, there are gratings which are embedded in the waveguide by a second epitaxy step. These embedded gratings usually have only a relatively weak refractive index contrast to the surrounding material or to the waveguiding region. The vertical mode in this case is almost unchanged in the grating region. In such buried gratings, the physical grating strength is typically not determined by the total reflectance R of the grating structure but instead by the equivalent coupling factor length product $\kappa_L$ (Crump et al., J. Phys. D: Appl. Phys. 46 (2013)). 013001). This product describes the local coupling between propagating guided waves in the forward and reverse direction. To produce the overgrown gratings, epitaxial growth must be interrupted, the gratings must be defined (e.g., by e-beam) and then overgrown. Usually such grating structures are referred to as buried gratings.

The invention is based on the knowledge that, in the region of high optical power density, in order to reduce the losses occurring in the resonator and to avoid saturation effects, for example longitudinal hole burning, the strength of the grating interaction must be reduced. From theoretical studies (Crump et al., J. Phys. D: Appl. Phys. 46 (2013) 013001) it is known that in particular in conventional broad area high-power laser diodes with distributed feedback in the longitudinal direction along the optical axis, a non-homogeneous distribution of optical power is established. In the case of one-sided outcoupling of the laser radiation, it is especially the case that the power density within the laser diode continuously increases in the direction of the outcoupling facet. The exact functional relationship depends on the specific design of the laser diode, but can be at least approximated by simple mathematical functions (linear, exponential, hyperbolic, . . . ) at least. Also, in order to reduce the sensitivity of the grating to variations that are technically unavoidable during production, for example in the etching depth during the generation of trenches, a variation of the coupling strength of the grating is advantageous. As a result, with a suitable choice of the coupling strength drop, it can be ensured that the grating has a sufficiently high reflectivity or coupling strength, at least in some areas.

An adaptation of the coupling strength of the grating to the optical power density within a laser diode with distributed feedback results in a laser diode according to the invention having a grating in which the coupling parameter of the grating is substantially inversely proportional to the optical power density within the laser diode. In particular, an adaptation of the coupling strength of the grating to the optical power density thus leads to a laser diode with distributed feedback, in which the coupling parameter decreases continuously from the rear facet to the front facet along the resonator axis. This can be done, for example, by according to the underlying proportionality ratios either decreasing the depth of adjacent trenches along this axis, or decreasing the width of the trenches along this axis, or decreasing the refractive index of the trenches along this axis. The grating used is preferably a surface grating, wherein the order of the grating is in the range between 10 and 100. By using such a grating of high order, the distances between the individual grating elements, that is between the trenches, based on the laser wavelength emitted by the laser diode, are significantly widened and thus the demands on the accuracy of the processing are reduced.

While the coupling parameter P of a trench represents a local measure for the strength of the interaction of a grating element with a wave guided in the waveguiding region, the effect of the grating as a whole can be described by means of a further determination variable, the so-called apodization measure A. From the condition stated in claim 1 that an average increase of the coupling parameter P for the plurality of trenches is non-zero, follows the presence of a maximum and a minimum value for the coupling parameter P of the plurality of trenches of the grating along the first (longitudinal) axis between rear facet and front facet of the laser diode according to the invention. That through $$A_P = \frac{\text{Maximum}\{P\}}{\text{Minimum}\{P\}}$$

given ratio is therefore, in addition to the average increase of the coupling parameter P, suitable to describe the effect of the grating as a whole.

The given equation for determining the apodization measure $A_P$ is based on purely geometrical and optical properties of the individual trenches, but does not take into account the specific interaction of the guided wave with the grating. Although the basic physical relationships are recorded with the correct sign, a general proportionality relationship can not be deduced directly from this. In order to be able to take into account the proportionality of the interaction, the physical grating strength can be used instead.

The following determination variables can be used in particular: (1) The local reflectance R(x) and (2) the coupling factor length product $\kappa_L(x)$ of the grating, in each case as a function of the longitudinal position x. Since the reflectance R and the coupling factor length product $\kappa_L$ of an individual grating ridge in the grating can not be reasonably calculated, instead the reflectivity R or the coupling factor length product $\kappa_L$ at the point x with the reflectivity of a corresponding, virtual, uniform grating, which extends over the entire cavity length is calculated. Since the reflectivity R or the coupling factor length product $\kappa_L$ of a grating is wavelength-dependent, the respective maximum values are always used. Depending on the present grating regime, the total reflectivity $R_{max}$ of the grating structures or the coupling factor length products $\kappa_L$ can then be determined from two uniform gratings of the same type, each with a minimum and a maximum coupling strength, and set in relation to one another.

In a variation according to the invention of the coupling parameter P by local change along the first axis at the points x thus follows an alternative formulation of apodization measure as $$A_R = \frac{\text{Maximum}\{R(x)\}}{\text{Minimum}\{R(x)\}} \text{ or } A_{\kappa L} = \frac{\text{Maximum}\{\kappa L(x)\}}{\text{Minimum}\{\kappa L(x)\}}.$$

By way of the local reflectance R(x) or the coupling factor length product $\kappa_L(x)$, direct conclusions can also be drawn regarding the proportional influence of the individual determination variables of the grating, in particular the depth d (or the distance of the trench to the active layer $d_{res}$), the width w and the refractive index n of the individual trenches of the grating or their respective refractive index contrast.

If, in particular, the local reflectance R(x) or the coupling factor length product $\kappa_L(x)$ is varied according to the invention along the resonator axis of the laser diode, the result is a preferred apodization measure A of greater than or equal to 1.1. Also preferred are apodization measures A of greater than or equal to 1.2, greater than or equal to 1.3, greater than or equal to 2, and greater than or equal to 3. Here, for a variation of the grating strength preferably an arbitrary functional relationship, a monotonic increase, a linear increase, or a quadratic increase along the longitudinal axis is particularly preferred. The increase can be directed both from the front facet to the rear facet and from the rear facet to the front facet. Particularly preferred is a functional relationship in which the coupling of the grating is adapted to the optical power density of the wave guided in the waveguiding region parallel to the longitudinal axis, thereby resulting in a constant interaction with the wave along this axis.

In a preferred embodiment of the invention, it is therefore provided that the grating has at least one apodization measure A of greater than or equal to 1.1.

In addition to such a global definition of apodization measure, a definition of the laser diode properties according to the invention can also be carried out via a corresponding variation V of the individual parameters of the trenches or of the grating along the grating structure. These are specific, particularly preferred embodiments of a laser diode according to the invention in which the average increase of the coupling parameter P for the plurality of trenches of the grating can be non-zero. In this case, a corresponding variation V can be defined in particular via the ratio of the respective maximum and minimum values of the corresponding parameter along the grating structure.

As a result, particularly preferred embodiments result from the variation of $V_{dres}$ at the distance of the individual trenches to the active layer, that is $$V_{dres} = \frac{\text{Maximum}\{d_{res}\}}{\text{Minimum}\{d_{res}\}},$$

greater than or equal to 1.1. Further preferred are variations $V_{dres}$ of greater than or equal to 1.2 and greater than or equal to 1.3.

Via a variation $V_w$ in the width w of the individual trenches by means of a corresponding equation of determination for the respective parameter ratio $$V_w = \frac{\text{Maximum}\{w\}}{\text{Minimum}\{w\}}$$

preferred embodiments for values greater than or equal to 1.1, greater than or equal to 1.2 and greater than or equal to 1.3 can be determined.

For the definition of further particularly preferred embodiments, the variation $V_{\Delta n}$ in the refractive index contrast $\Delta n$ between the respective refractive index of a trench and the refractive index of the material enclosing the trench is to be used. Preferred embodiments then result by means of $$V_{\Delta n} = \frac{\text{Maximum}\{\Delta n\}}{\text{Minimum}\{\Delta n\}}$$

for variations $V_{\Delta n}$ for values greater than or equal to 1.1, greater than or equal to 1.2 and greater than or equal to 1.3.

As a further variation parameter, the distance of the individual trenches over the grating constant $\Lambda$ along the grating can be variable, whereby the Bragg condition ($\lambda_B = 2 n_{\mathit{eff}} \Lambda/N$) for each integer N is fulfilled for the respective effective refractive index $n_{\mathit{eff}}$ of an individual trench. Via a variation $V_\Lambda$ in the grating constant $\Lambda$ of the grating, that is in the distance of adjacent trenches, by means of a corresponding determination equation for the respective parameter ratio $$V_\Lambda = \frac{\text{Maximum}\{\Lambda\}}{\text{Minimum}\{\Lambda\}}$$

preferred embodiments for values greater than or equal to 1.1, greater than or equal to 1.2 and greater than or equal to 1.3 can be determined.

In a laser diode according to the invention, an arbitrary functional relationship between the grating strength, which can be described either globally by one of the aforementioned apodization measures or a corresponding variation parameter, can be set along the resonator axis. A monotonic functional relationship of the grating strength along the resonator is particularly preferred. Further preferred is a linear functional relationship of the grating strength along the resonator. Also preferred is a quadratic functional relationship of the grating strength along the resonator. Particularly preferred is a functional relationship of the grating strength along the resonator, which is adapted to the power density of the wave guided in the laser diode, wherein in the areas of high power density, the grating strength is decreased compared to the grating strength in the areas of low power density.

In a laser diode according to the invention, the orientation of the functional relationship of the grating strength along the resonator is freely adjustable. However, a grating strength increasing from the front facet to the rear facet is particularly preferred.

The generated grating can be either a passive, an active or a semi-active grating. Thereby actively and passively indicates the presence of an optical amplification in the region of the grating. If an optical amplification only takes place in individual subregions of the grating, then it is a semi-active grating.

In the technical implementation of a laser diode according to the invention a grating length of greater than or equal to 100 µm is particularly preferred. Further preferred is a grating length which corresponds to greater than or equal to 10% of the length of the resonator, wherein the length of the resonator is given by the distance between the front facet and rear facet. Also preferred is a grating length of greater than or equal to 20% of the length of the resonator. The grating can also be extended over the entire length of the resonator. For a shorter grating length, the position of the grating along the first axis, that is along the longitudinal axis or the resonator axis, in principle arbitrarily adjustable. However, positioning directly on the front and/or rear facet is particularly preferred. Likewise, the grating can be divided into several subregions. The subregions do not have to be contiguous and can be distributed arbitrarily along the resonator axis. In particular, the individual grating subregions can also be designed to be passive, active or semi-active.

In a further preferred embodiment of the invention, it is provided that the idea according to the invention of adapting the coupling strength of the grating to the power density of the wave guided in the waveguiding region can also be transmitted onto an axis perpendicular to the active layer. In particular, a tapering of the width of the trenches in the direction of the active layer is advantageous. A particularly V-shaped taper of the width of the trenches in the direction of the active layer is particularly advantageous.

In a further preferred embodiment of the invention, it is provided that the idea according to the invention of adapting the coupling strength of the grating to the power density of the wave guided in the waveguiding region can also be transmitted along a second axis which extends perpendicular to the first axis. For this purpose, the coupling parameter within a trench is considered as a direct function of the location along this axis, and this location-dependent coupling parameter of a trench is adapted to the power density of the wave guided in the waveguiding region, wherein in the areas of high power density the value of the location-dependent coupling parameter of the trench is decreased compared to value of the location-dependent coupling parameter of the trench in the areas of low power density.

Another aspect of the present invention relates to a method of producing a laser diode having the above features. The methods used within this method depend essentially on the particular embodiment of the invention and can be selected as needed. For example, the ridges of the grating can be generated by a targeted structural change of a suitable material for the formation of the grating. In this case, in particular, the implantation of impurities by means of FIB or material changes are possible, for example by the targeted initiation of local crystallization or amorphization processes. By means of such a type of processing, it is generally possible to influence the individual parameters determining the coupling parameters (depth, width and refractive index or refractive index contrast to the surroundings of a ridge) and the resulting grating strength along the resonator (via $R_{max}(x)$ or $\kappa_L(x)$ determined) at the same time. Another way of processing is by exposing the trenches directly. This can be done in particular by applying a suitable etching process. The trenches generated in this case then have a refractive index reduced to their surroundings, for example air. However, it is also possible to use a refractive index change for further influencing the coupling parameter course, by subsequently filling the trenches with another material or dielectric (for example by selectively overgrowing the trench walls), in addition to the purely geometric modification of the coupling strength.

Said method for producing a laser diode having the above-mentioned features particularly preferably comprises applying an etching mask having a plurality of openings to the waveguiding region, wherein the width of the openings varies locally along a first axis and/or a second axis, and patterning of the masked waveguiding region by a suitable etching process. This etching process may preferably be anisotropic reactive ion etching.

The advantage of using such an etching process lies in the possibility of utilizing the so-called microloading effect. This effect describes a dependence of the observed etching rate on the characteristic size of a structure to be etched. In particular, in the generation of sub-µm-trenches, the etching rate and thus the achievable etch depth during a given etching time is dependent on the width of the etch mask and the current etching depth of the trench. With knowledge of the corresponding relationships, a controlled variation in the etching depth can thus be achieved by specifying the width of a etch mask. Through a targeted utilization of this effect, an adaptation according to the invention of the coupling strength of the grating to the wave guided in the waveguiding region can take place within a single etching process.

Further preferred embodiments of the invention will become apparent from the remaining features mentioned in the subclaims.

The various embodiments of the invention mentioned in this application, unless otherwise stated in the individual case, can advantageously be combined with one another.

BRIEF DESCRIPTION OF THE FIGURES

The invention will be explained below in embodiments with reference to the accompanying drawings. In particular.

DETAILED DESCRIPTION OF THE INVENTION

Figure 1:
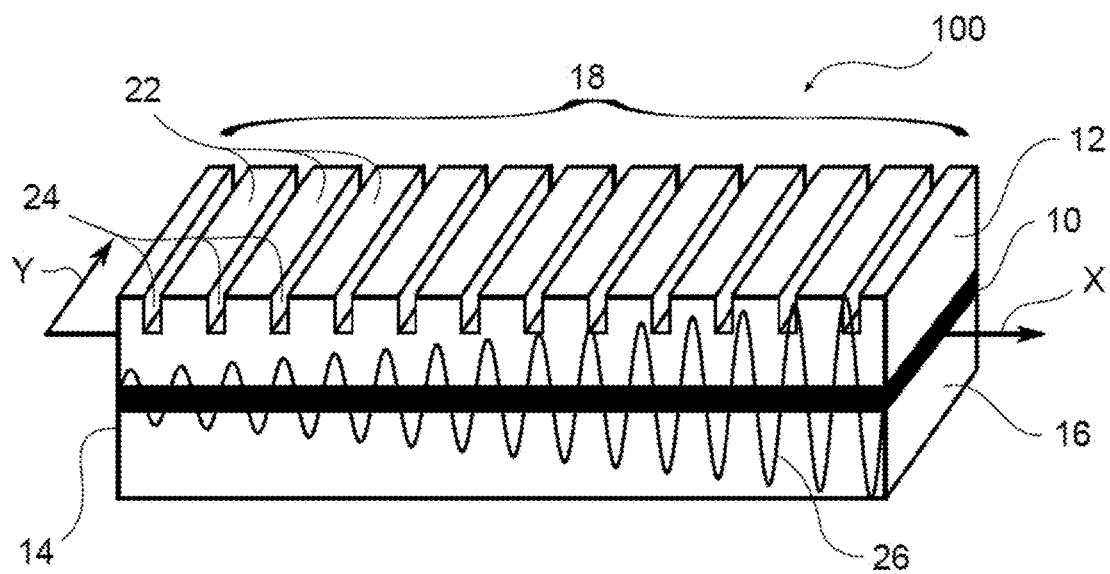
FIG. 1 a spatial schematic representation of a laser diode with distributed feedback according to the prior art.

FIG. 1 shows a spatially schematic representation of a laser diode 100 with distributed feedback according to the prior art. An active layer 10 is enclosed at the top and bottom by a directly adjacent waveguiding region 12. The generation and propagation of the laser radiation preferably takes place along a first axis X (simultaneously the optical axis). For this purpose, a second axis Y extends parallel to the active layer 10. The edges of the laser diode 100 pierced by the first axis X form a rear facet 14 and a front facet 16. In this case, the laser radiation generated in the laser diode 100 exits via the front facet 16. This can be provided with an additionally applied antireflection coating. The rear facet 14, however, is often provided with a mirror coating to suppress outcoupling. During operation of the laser diode, a wave 26 builds up between the front facet 16 and the rear facet 14, which is guided through the waveguiding region 12 along the first axis X. Within the laser diode 100, a location-dependent power density distribution is due to the internal structure. The underlying distribution function depends essentially on the respective damping and feedback properties of the laser diode 100. In the representation, an increase in the internal power density in the direction of the front facet 16 is indicated by an increasing amplitude of the guided wave 26. In the case of a laser diode 100 with distributed feedback, the wave 26 guided in the waveguiding region 12 interacts at least in sections with a grating 18, wherein the grating 18 comprises a plurality of ridges 22 and trenches 24. By means of the interaction of the guided wave 26 with the grating 18, a frequency selection of the generated laser radiation takes place, so that a limitation of the emission to single or a few amplification modes can take place. In the case of a grating 18 according to the prior art, the depth and width of the individual trenches 24 are substantially constant except for manufacturing tolerances. Therefore, a grating 18 according to the prior art typically has no or little local dependence of the grating characteristics. Due to the above-mentioned spatial dependence of the power density distribution, however, the interaction between the wave 26 guided in the waveguiding region 12 and the grating 18 is also highly location-dependent, which has a negative effect on the emission characteristics of the laser diode 100.

Figure 2:
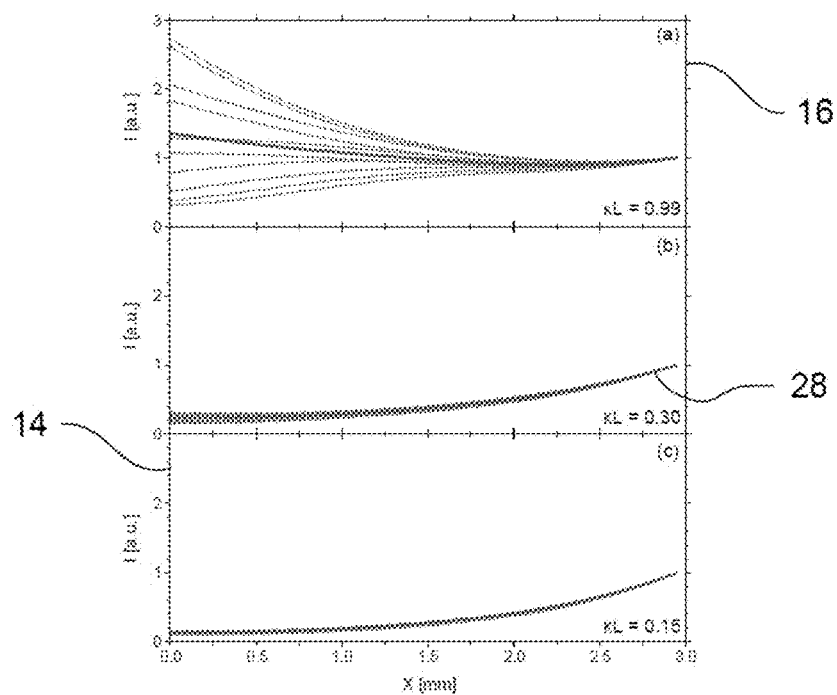
FIG. 2 theoretical calculations for longitudinal power distribution in laser diodes with distributed feedback according to the prior art.

FIG. 2 shows theoretical calculations for longitudinal power distribution in laser diodes with distributed feedback according to the prior art (Crump et al., J. Phys. D: Appl. Phys. 46 (2013) 013001). The figure shows the average power distribution 28 of a laser diode 100 with distributed feedback in the longitudinal direction along a first axis X, respectively, at the threshold current for different coupling factor length products $\kappa_L$ (proportional to the coupling parameter) between the wave 26 guided in the waveguiding region 12 and a corresponding grating 18 according to the prior art. The left side of the graph corresponds to a position on the rear facet 14 of the laser diode 100 and the right side of the graphs corresponds to a position on the front facet 16 of the laser diode 100. The distance between rear facet 14 and front facet 16 is 3 mm in this example. The contour lines additionally drawn in dashed lines in the graph correspond to power distributions taking into account the influence of a variable phase state in the reflection at the rear facet 14. It can be seen that the average power distribution 28 of a laser diode 100 with distributed feedback in the longitudinal direction along the first axis X for a plurality of cases has no constant value and instead an increase in the direction of the front facet 16 takes place.

Figure 3A:
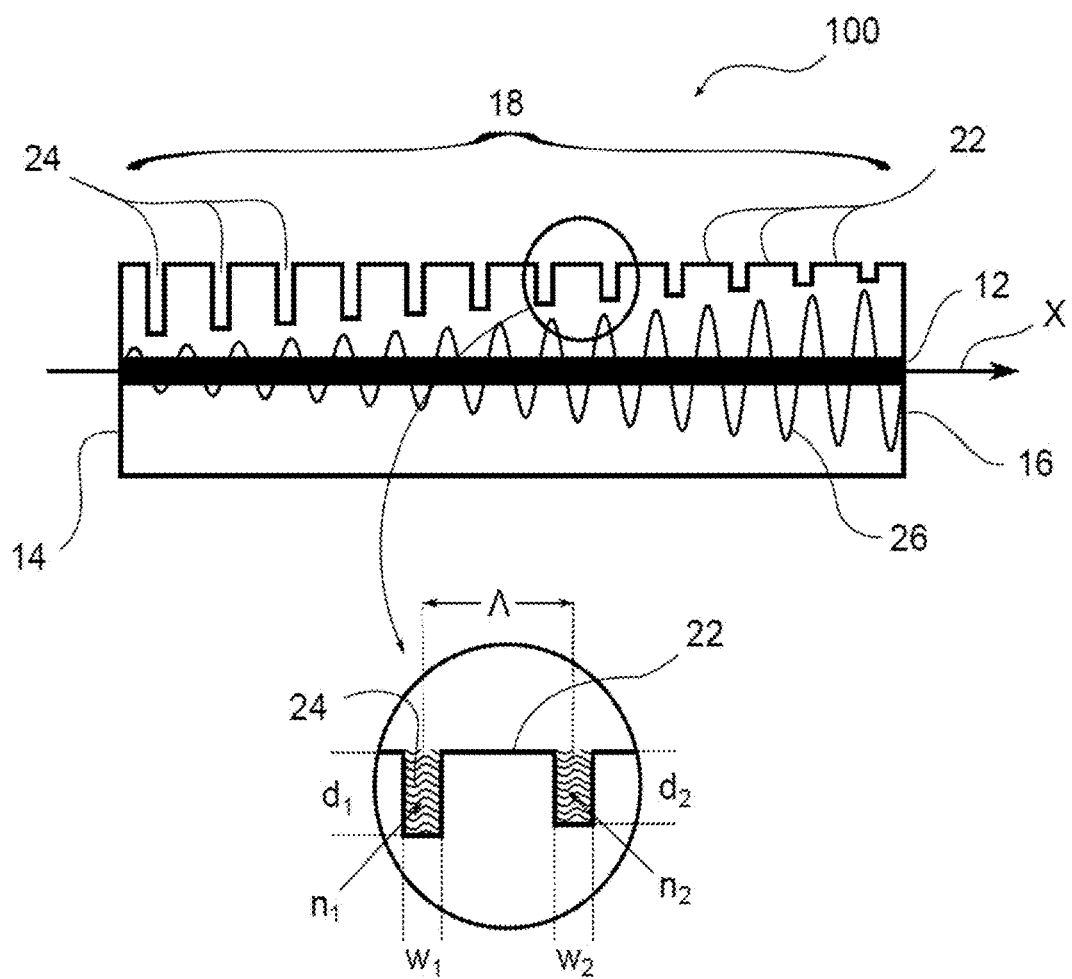
FIG. 3a, 3b schematic representations of a preferred embodiment of a laser diode with distributed feedback according to the invention.

FIG. 3a shows a schematic representation of a preferred embodiment of a laser diode 100 with distributed feedback according to the invention. The representation shown and the allocation of the individual reference marks correspond largely to FIG. 1. The essential difference is, however, in the structural design of the grating 18. In contrast to the grating 18 in FIG. 1, this has been modified such that an adaptation of the coupling of the grating to the power density of the wave 26 guided in the waveguiding region 12 is made possible. For this purpose, in the embodiment shown, the depth d of the individual trenches 24 of the grating 18 along a first axis X, starting from a maximum trench depth $d_{max}$ in the vicinity of the rear facet 14 to a minimum trench depth $d_{min}$ in the vicinity of the front facet 16 is continuously reduced. By varying the trench depth d, it is achieved that in the area of high power density, a decreased interaction takes place between the wave 26 guided in the waveguiding region 12 and the grating 18, while in the area of low power density, an increased interaction between the wave 26 guided in the waveguiding region 12 and the grating 18 takes place. As a result, in particular saturation effects in the amplification can be avoided or at least reduced. In FIG. 3a, to further clarify the geometric properties of the grating 18, a subregion is particularly emphasized. There two adjacent trenches 24 are shown, which are separated by a ridge 22 from each other. The average distance of the trenches corresponds to a grating constant Λ, which defines the central wavelength of the grating 18. The individual trenches 24 in turn can each be described by an average width w, an average depth d and a refractive index n, and the $R_{max}(x)$ and $\kappa_L(x)$ resulting from these parameters. In particular, each of these three parameters can be varied independently of one another, wherein such a variation influences the interaction between the wave 26 guided in the waveguiding region 12 and the grating 18. In the embodiment shown, in each case the width w and the refractive index n of the trenches 24 can be assumed to be constant for all elements of an N-element grating 18, such that $w_1=w_2=w_N$ and $n_1=n_2=n_N$. The depth of the trenches 24 of the grating 18, on the other hand, is increasingly reduced towards the front facet 16 and is therefore described by an inequality $d_1>d_2>d_N$.

Figure 3B:
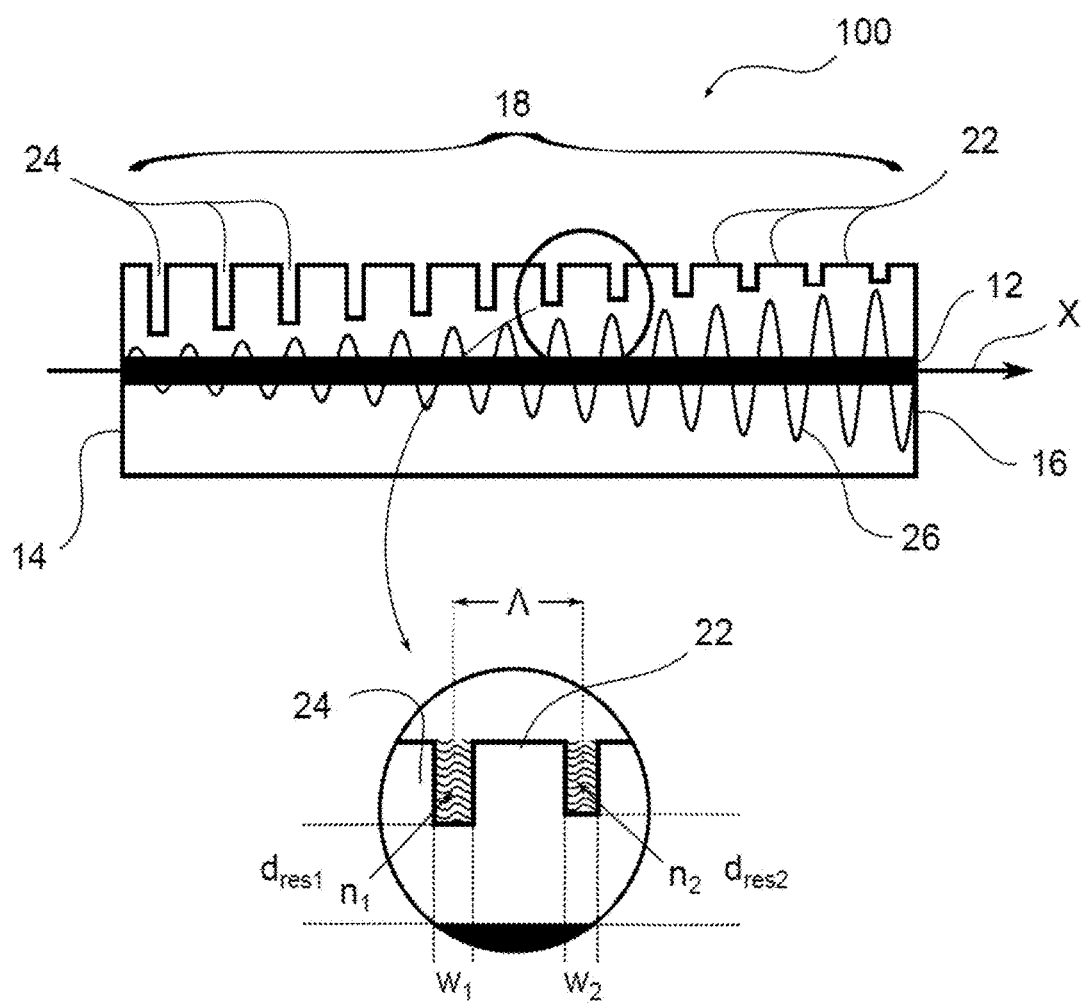

FIG. 3b shows an identical schematic representation of a preferred embodiment of a laser diode 100 with distributed feedback according to the invention. In contrast to the representation shown in FIG. 3a, however, the definition of the parameter $d_{res}$ as the distance of the trench 24 to the active layer 10 is shown here. In the present case, $d_{res}$ is linked to d via the distance of the upper edge of the grating 18 to the active layer 10. All other reference marks and parameters are consistent with the facts shown in FIG. 3a, the description applies accordingly. Also for this embodiment, it can be assumed that $w_1=w_2=w_N$ and $n_1=n_2=n_N$. The distances between the trenches 24 of the grating 18 to the active layer 10, on the other hand, are increasing towards the front facet 16 and are therefore described here by an inequality $d_{res1}<d_{res2}<d_{resN}$.

Figure 4:
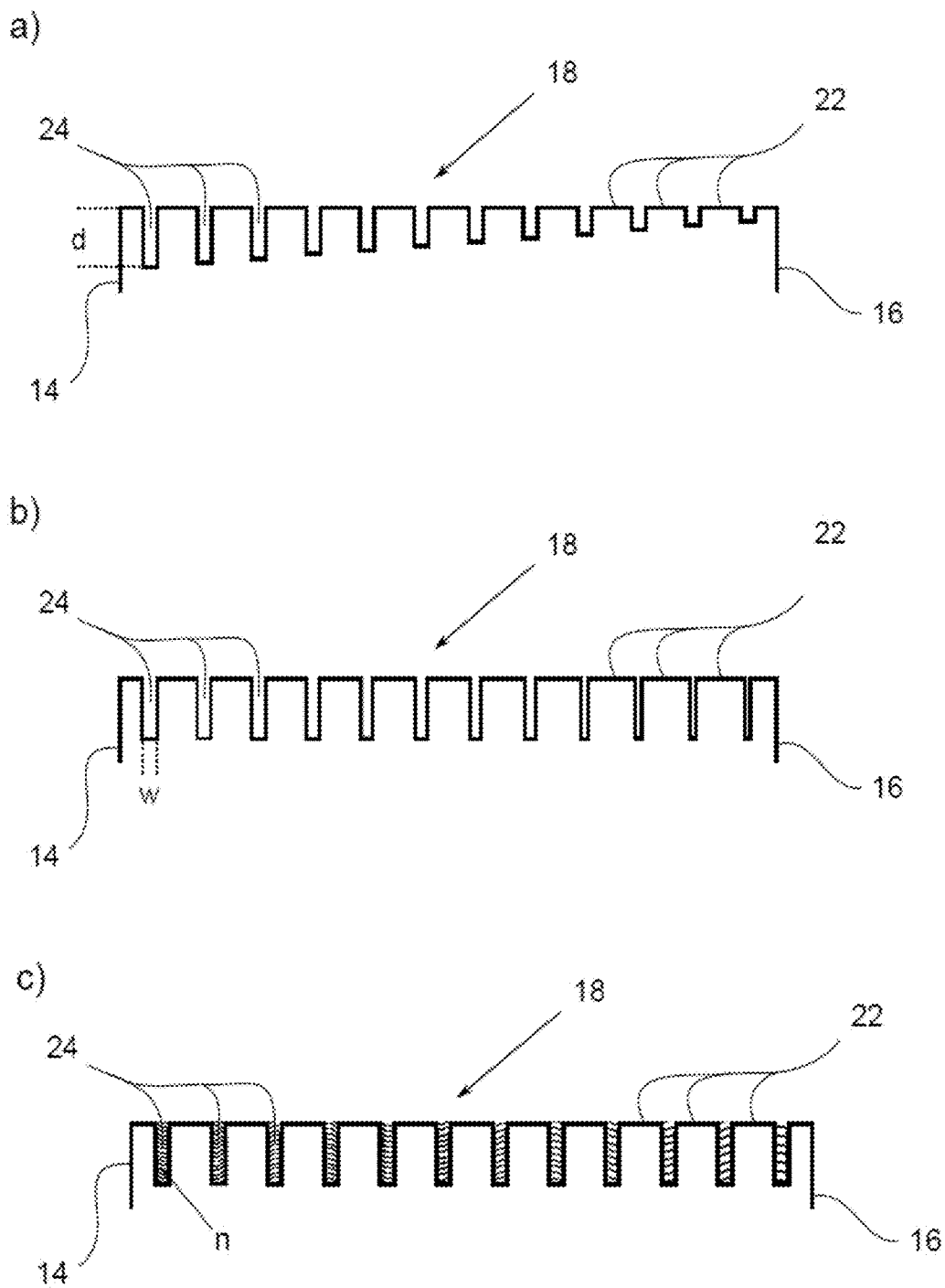
FIG. 4 three schematic representations of preferred embodiments of the grating structure of a laser diode with distributed feedback according to the invention.

FIG. 4 shows three schematic representations of preferred embodiments of the grating structure 18 of a laser diode 100 with distributed feedback according to the invention. The representation shown in FIG. 4a corresponds to the structure of the grating 18 described in FIG. 3 with varying trench depth d with a constant trench width w and a constant refractive index n of the trenches 24. The assignment of the individual reference marks applies accordingly. In contrast, in the representation according to FIG. 4b, the trench depth d and the refractive index n of the trenches 24 remain constant, while the width w of the individual trenches between the rear facet 14 and the front facet 16 is varied. In particular, a decrease of the width of the trenches 24 in the direction of the front facet 16 is shown. In the representation shown in FIG. 4c, a grating 18 is shown in which both the depth d of the individual trenches 24 and the width w of these trenches 24 are kept constant. In this embodiment, only the refractive index n of the individual trenches 24 of the grating 18 is changed. This change can be achieved, for example, by selectively filling or partially coating trenches 24 etched into a material suitable for forming a grating 18 or by implanting impurities in said material respectively. All of these embodiments have in common that thereby the strength of the interaction between the wave 26 guided in the waveguiding region 12 and the grating 18 along the optical axis can be varied. However, the exemplary embodiments mentioned represent only a partial area of the total possibilities available for influencing. In particular, the interaction can be influenced in a particularly targeted manner by a clever combination of the named embodiments. This allows, inter alia, that in the production of a laser diode 100 according to the invention the specific characteristics of certain procedures can be taken into account and it also enables a most possible minimization of the disturbing influence of manufacturing tolerances.

Figure 5:
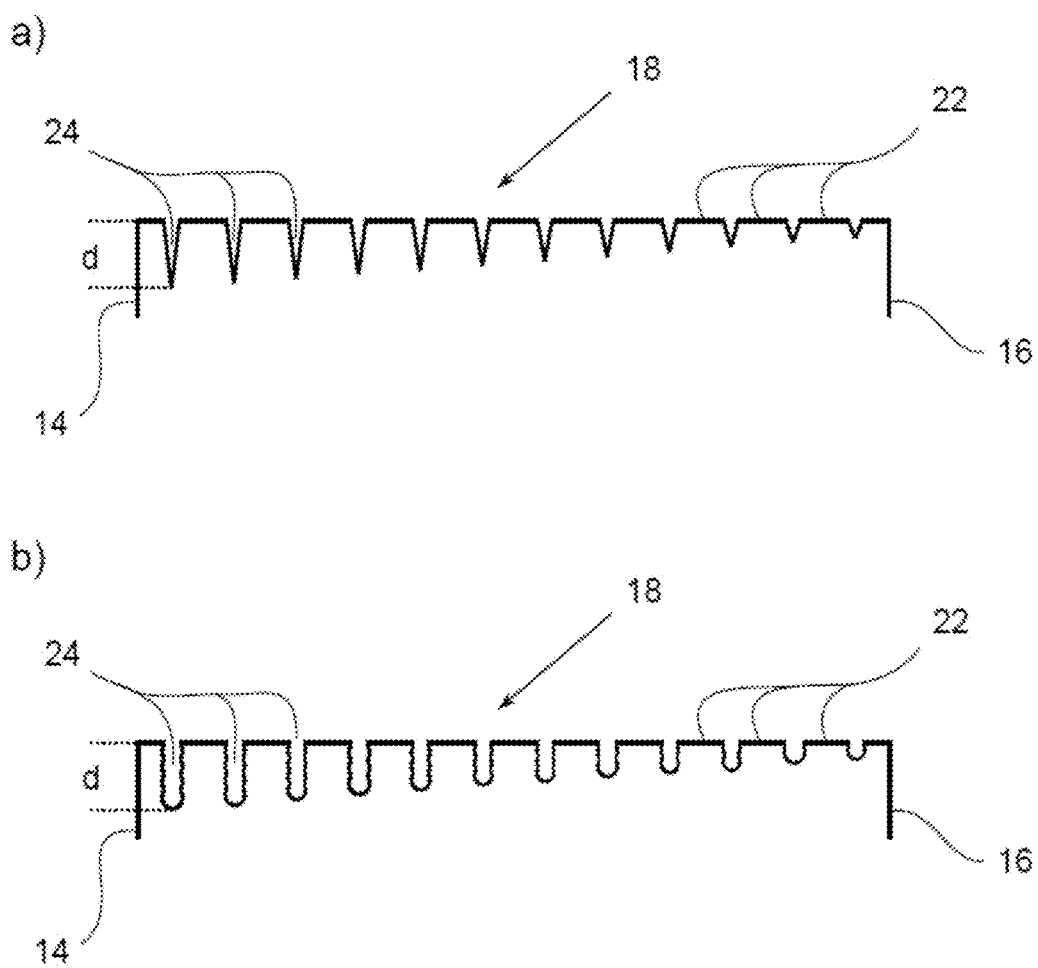
FIG. 5 schematic representations of particularly preferred embodiments of the grating structure of a laser diode with distributed feedback according to the invention.

FIG. 5 shows schematic representations of particularly preferred embodiments of the grating structure 18 of a laser diode 100 with distributed feedback according to the invention. For the representation, an arrangement of the ridges 22 and trenches 24 of the grating 18 was chosen, as it corresponds to the figure in FIG. 4a, that is in which the depth d of the trenches 24 of the grating 18, starting from the rear facet 14 to the front facet 16 increasingly decreases. In contrast to the aforementioned embodiments and examples, however, the individual trenches 24 here have a wall structure deviating from the rectangular shape which is always used by way of example in the previous figures. Particularly preferred is the grating structure shown in FIG. 5a, in which the width w of the trenches 24 tapers in the direction of the active layer 10 in a continuous V-shaped manner. Such an arrangement makes it possible to influence the interaction between the wave 26 guided in the waveguiding region 12 and the grating 18 also in a direction perpendicular to the active layer 10 and thus also adapt the coupling of the grating 18 to the power density distribution occurring in the laser diode 100 along this direction. In this respect, this embodiment represents a variation of the depth d of the trenches 24 with a overlaid variation of the width w within the individual trenches 24. The figure shown in FIG. 5b also shows a variation of the depth d of the individual trenches 24 with a overlaid variation of the width w within the individual trenches 24. This example may, for example, be the result of an anisotropic etching process in which the etched walls do not have a uniformly smooth structure.

Figure 6:
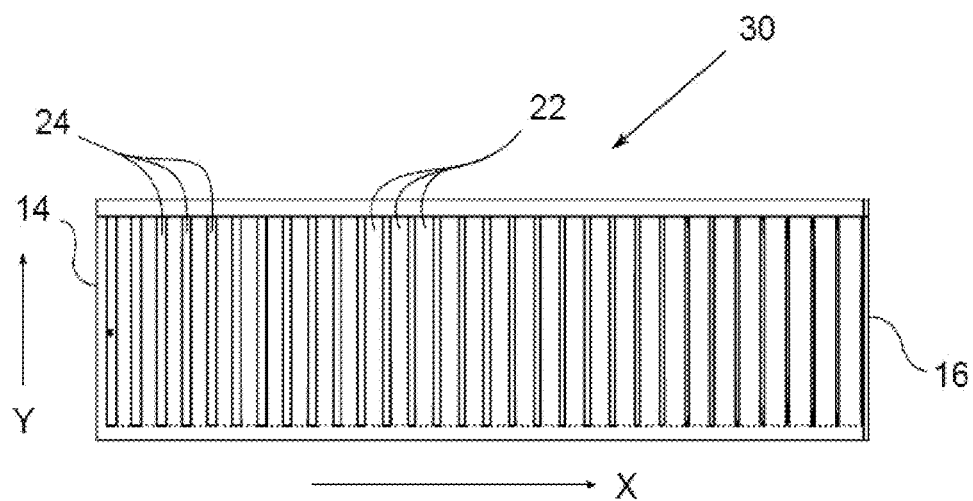
FIG. 6 schematic representations of an etching mask for producing a preferred embodiment of a laser diode with distributed feedback according to the invention in plan view and in cross-section after the etching.
Figure 6:
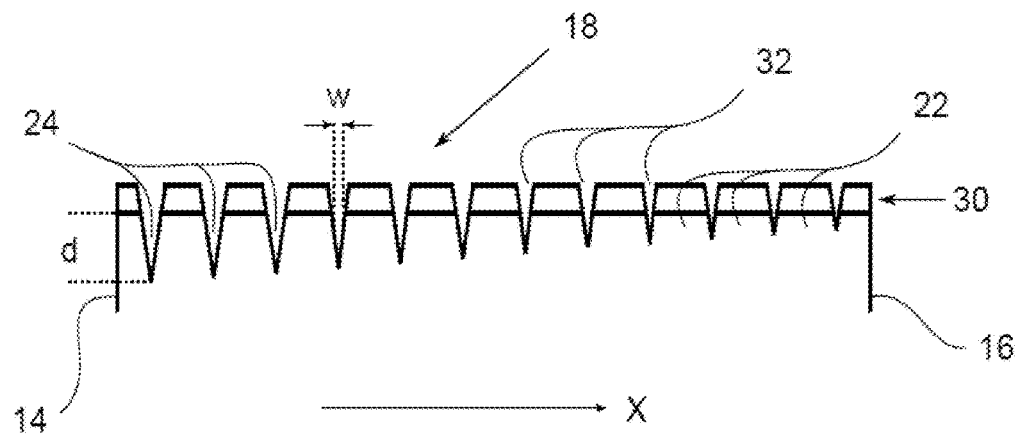

FIG. 6 shows schematic representations of an etching mask 30 for producing a preferred embodiment of a laser diode 100 with distributed feedback according to the invention in plan view and in cross-section after the etching. The etching mask 30 shown in plan view in FIG. 6a can be produced, for example, by means of contact lithography. The etching mask 30 has different areas with a plurality of openings 32, by which the properties of the generated grating 18 are determined. The illustrated etching mask 30 is adapted to form a grating 18 along a first direction X which extends between a rear facet 14 and a front facet 16, wherein the depth d of the individual trenches 24 according to a preferred embodiment of FIG. 3 along a first direction X is increasingly reduced. In particular, this is achieved in that, according to the invention, the width of the individual openings 32 of the etching mask 30 along the first direction X is also reduced. In the case of reactive ion etching, the microloading effect can thereby be utilized, which, via a variation in the width of the openings 32 of the etching mask 30, effects a variation in the depth d of the trenches 24 obtained during the etching process. The variation of the etch mask can also be generated by alternative methods such as e-beam. By means of a corresponding design of the mask 30, a targeted influencing of the width w and the depth d of the generated trenches 24 as well as the resulting $R_{max}(x)$ and $\kappa_L(x)$ can therefore take place. This effect can be further enhanced or optimized by combined use of individual features of the aforementioned preferred embodiments of a laser diode 100 with distributed feedback according to the invention. FIG. 6b shows the cross-section of an etching mask 30 for producing a preferred embodiment of a laser diode 100 with distributed feedback according to the invention. Visible are the ridges 22 and trenches 24 of the grating 18 produced and the etching mask 30 used for covering during the etching process, with their openings 32.

Figure 7:
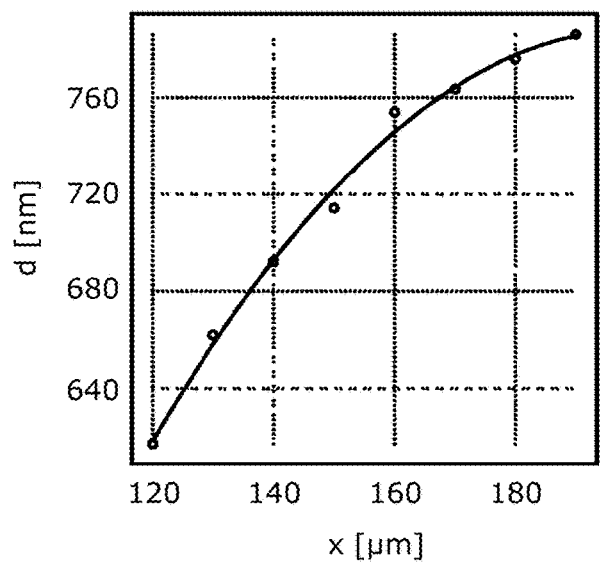
FIG. 7 the experimentally achieved trench depth in the production of a preferred embodiment of a laser diode with distributed feedback according to the invention using a mask according to FIG. 6.

FIG. 7 shows the experimentally determined trench depth after producing a preferred embodiment of a laser diode 100 with distributed feedback using an etching mask 30 shown in FIG. 6. The abscissa of the illustrated diagram indicates the absolute position of a trench 24 along the longitudinal first direction X wherein the distance between the individual trenches 24 is 10 μm in each case. The ordinate of the diagram corresponds to the measured trench depth d of the respective trench 24. Due to the different width of the openings 32 of the etching mask 30, the anisotropic reactive ion etching leads to the microloading effect, which according to the invention leads to the desired variation in the measured trench depth d. The experimentally determined depths d of the trenches 24 are shown as individual circles. The solid line corresponds to an averaged progression of the depth modulation achieved. In this case, a larger trench depth d corresponds to a wider opening 32 in the etching mask 30. A smaller trench depth d, on the other hand, can be associated with a narrower opening 32 in the etching mask 30. The microloading effect used according to the invention for producing the laser diode 100 with distributed feedback can be calculated very precisely in advance with respect to the further grating parameters, so that via the etching mask 30 in a laser diode 100 with distributed feedback according to the invention an accurate adjustment of the strength of the interaction between the wave 26 guided in the waveguiding region 12 and the grating 18 can be made.

Figure 8:
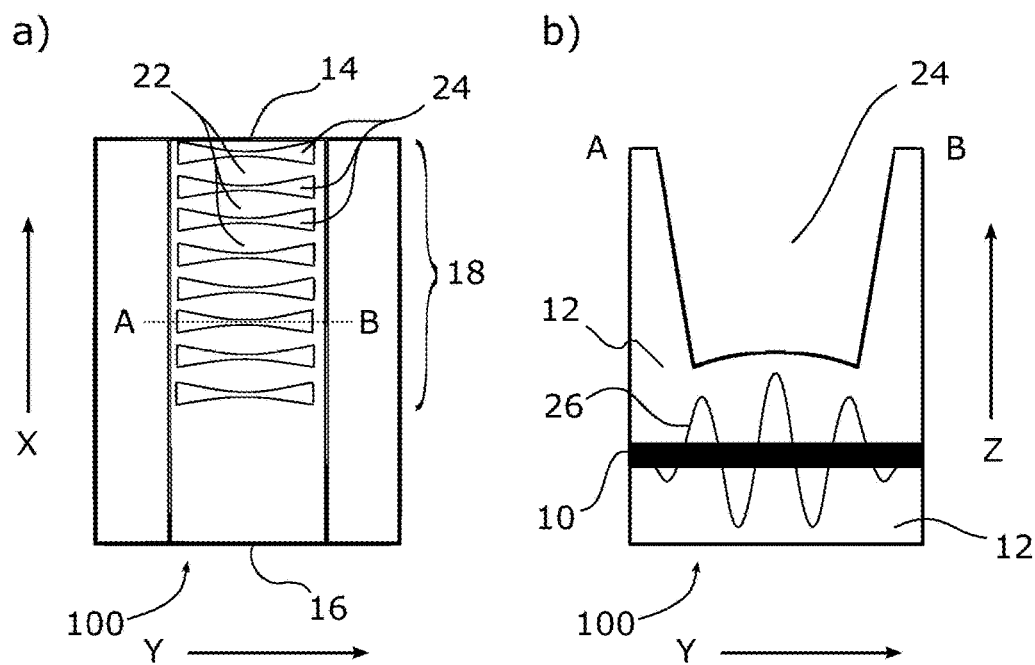
FIG. 8 schematic representations of another preferred embodiment of a laser diode with distributed feedback according to the invention in plan view and in cross-section.

FIG. 8 shows schematic representations of a further preferred embodiment of a laser diode 100 with distributed feedback according to the invention in plan view and in cross-section. FIG. 8a shows a plan view of the grating 18 of a laser diode 100 with distributed feedback according to the invention. This plan view extends along a first direction X and a second direction Y, wherein the rear facet 14 and the front facet 16 are cut in each case. Partly between these two facets, the grating 18 extends along the first direction X. According to the preceding embodiments, this grating has a plurality of ridges 22 and trenches 24, wherein the width w of these trenches 24 in both, the first direction X and in the second direction Y, can differ. In this way, a variation of the interaction between the wave 26 guided in the waveguiding region 12 and the grating 18 is also possible along the second direction Y, so that in this direction an adaptation according to the invention of the coupling strength of the grating 18 to the local power density distribution within the laser diode 100 with distributed feedback can be achieved. The variation of the depth d of the individual trenches along the line A-B drawn in FIG. 8a produced by the microloading effect during reactive ion etching can be seen in FIG. 8b. Analogous to the previous description, the depth d of the trenches 24 is reduced in the area of small trench width w, while in the areas of high trench width w, a higher trench depth d is also achieved. This results in a correspondingly higher $R_{max}(x)$ and $\kappa_L(x)$. By means of a corresponding combination with a V-shaped etching profile shown in FIG. 5a, an adaptation of the coupling strength of the grating 18 to the wave 26 guided in the waveguiding region 12 can thus be achieved in all three spatial directions.

The implementation of the idea according to the invention was successfully demonstrated in series of measurements. In particular, broad area laser diodes with distributed feedback according to the invention are generated, having coupling strength varying along the optical axis by matching the coupling parameter to the power density within the laser diode. In addition to laser diodes with grating structures of constant trench depth according to the prior art, laser diodes having a grating depth decreasing towards the front facet were also processed. The laser diodes were then coated on the rear facet with a reflectance $R_R$=95% and on the front facet with a reflectance $R_F$<0.05%. For the laser diodes, power characteristics could be recorded in continuous wave mode at currents up to 2 A. In addition, the spectral emission was measured at temperatures of −20° C. to 50° C. in 5° C. increments to determine the thermal locking range ΔT. This indicates over which temperature range the emission remains longitudinally single-mode without the other Bragg or Fabry-Pérot modes start lasing.

Figure 9:
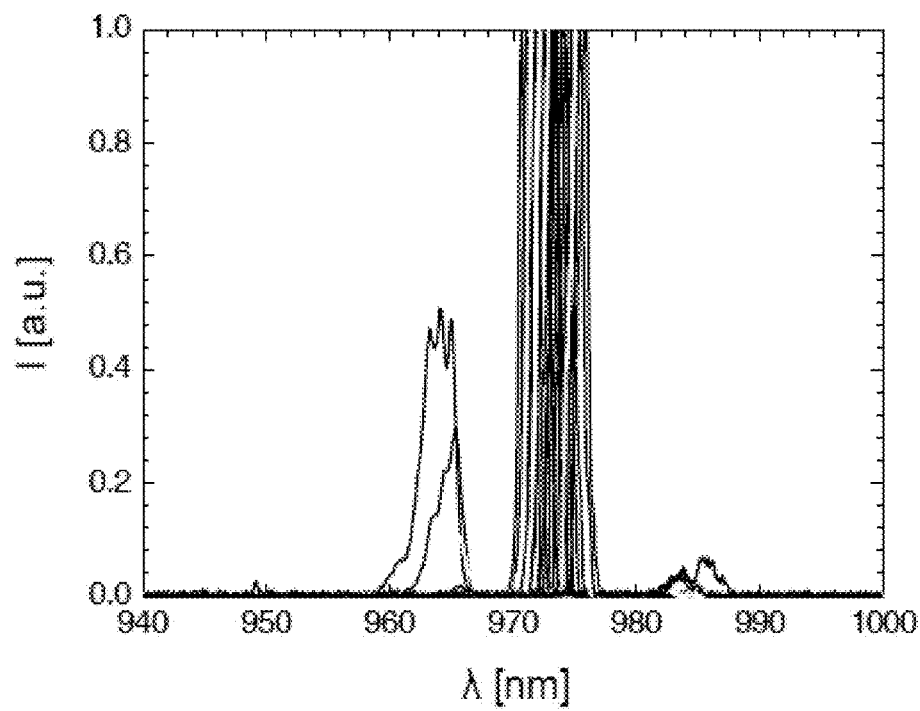
FIG. 9 an exemplary power curve of a conventional laser diode with distributed feedback through a uniform grating.
Figure 9:
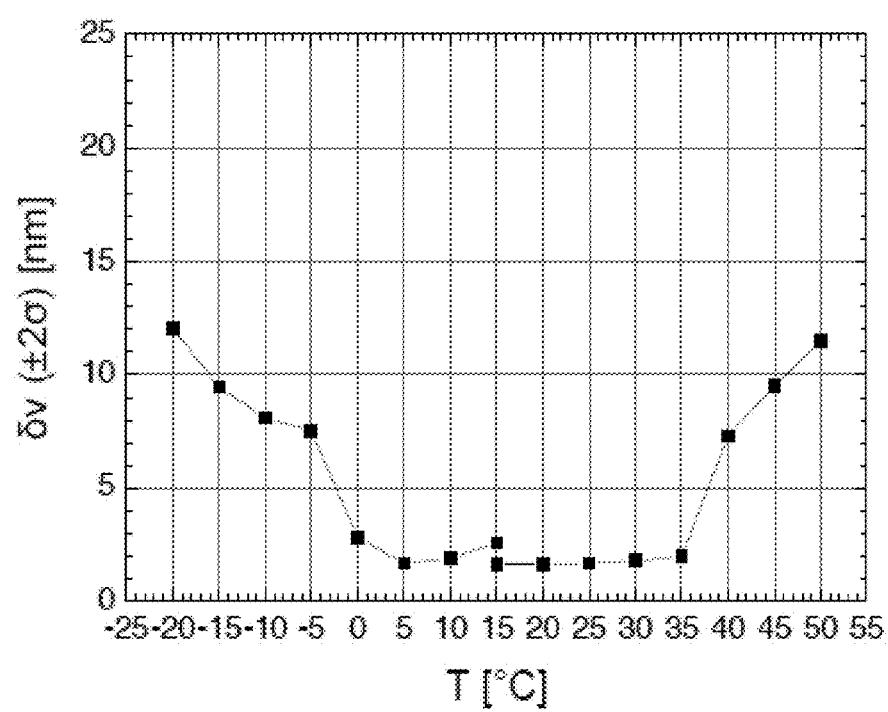

FIG. 9 shows an exemplary performance curve of a conventional laser diode with distributed feedback through a uniform grating (Crump et al., J. Phys. D: Appl. Phys. 46 (2013) 013001). The laser diode emits radiation preferably in the wavelength range around 973 nm and can be excited by thermal tuning substantially over a range of 6 nm between 970 nm and 976 nm to a narrow-band emission at typical line widths below 1 nm (±2σ). The locking range ΔT of the laser diode is 35 K. The wavelength shifts thermally at about 0.08 nm/K. Here, the electro-optical power increase measured at a working temperature T of about 20° C. was S=0.9 W/A.

Figure 10:
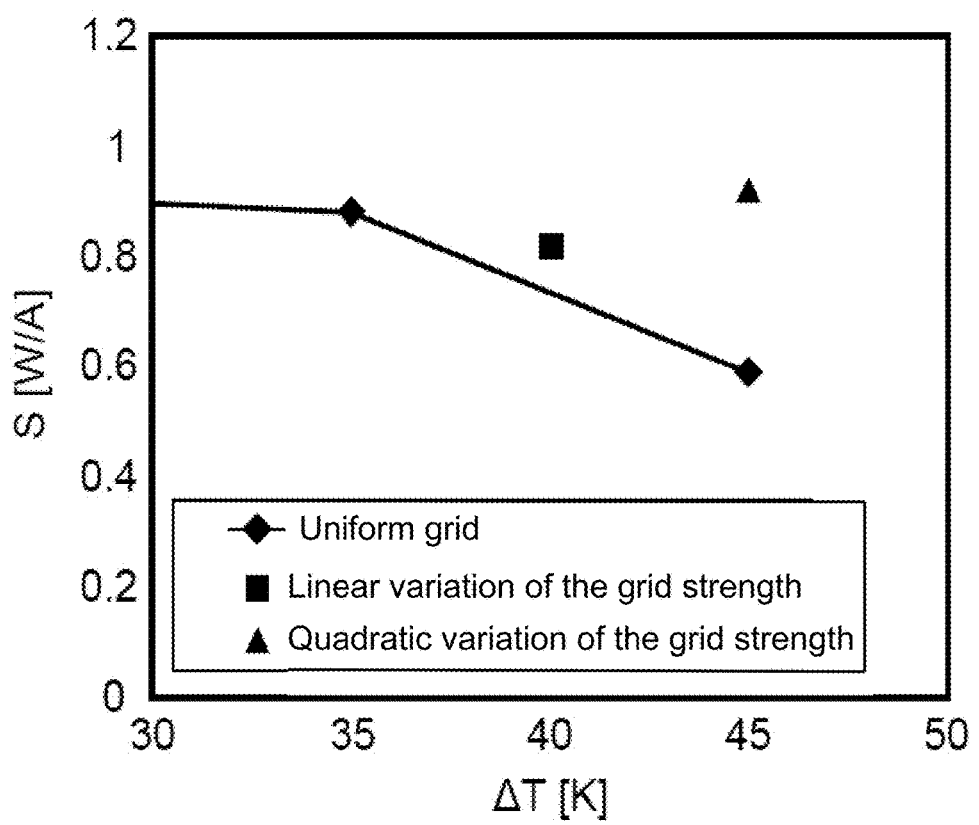
FIG. 10 the performance of preferred embodiments of laser diodes with distributed feedback ($A_{P1}=3.0$) in comparison to a conventional laser diode with distributed feedback through a uniform grating (equivalent to $A_{P1}=1.0$)

FIG. 10 shows the performance of preferred embodiments of laser diodes 100 with distributed feedback in comparison to a conventional laser diode with distributed feedback through a uniform grating. Here, respectively, the maximum measured electro-optical power increase S are plotted against the temperature T in the temperature range ΔT of the laser diode. In the case of the conventional grating shown here, in contrast to the power curve shown in FIG. 9, the locking range ΔT of the laser diode could be extended to 45 K by changing the grating parameters. However, as can be seen from the corresponding curve, the electro-optical power increase S clearly drops in this range with values below 0.6 W/A, so that in general high-power laser diodes must also be expected to have a falling output line in this spectral range. In a laser diode according to the invention with a linear variation of the grating strength $R_{max}(x)$ and $\kappa_L(x)$, a locking range ΔT of 40 K was measured. The electro-optical power increase S also remained in this range at a value of more than 0.8 W/A. With a quadratic variation of the grating strength, a locking range ΔT of 45 K could be measured with an electro-optical power increase S of about 0.9 W/A.

Figure 11:
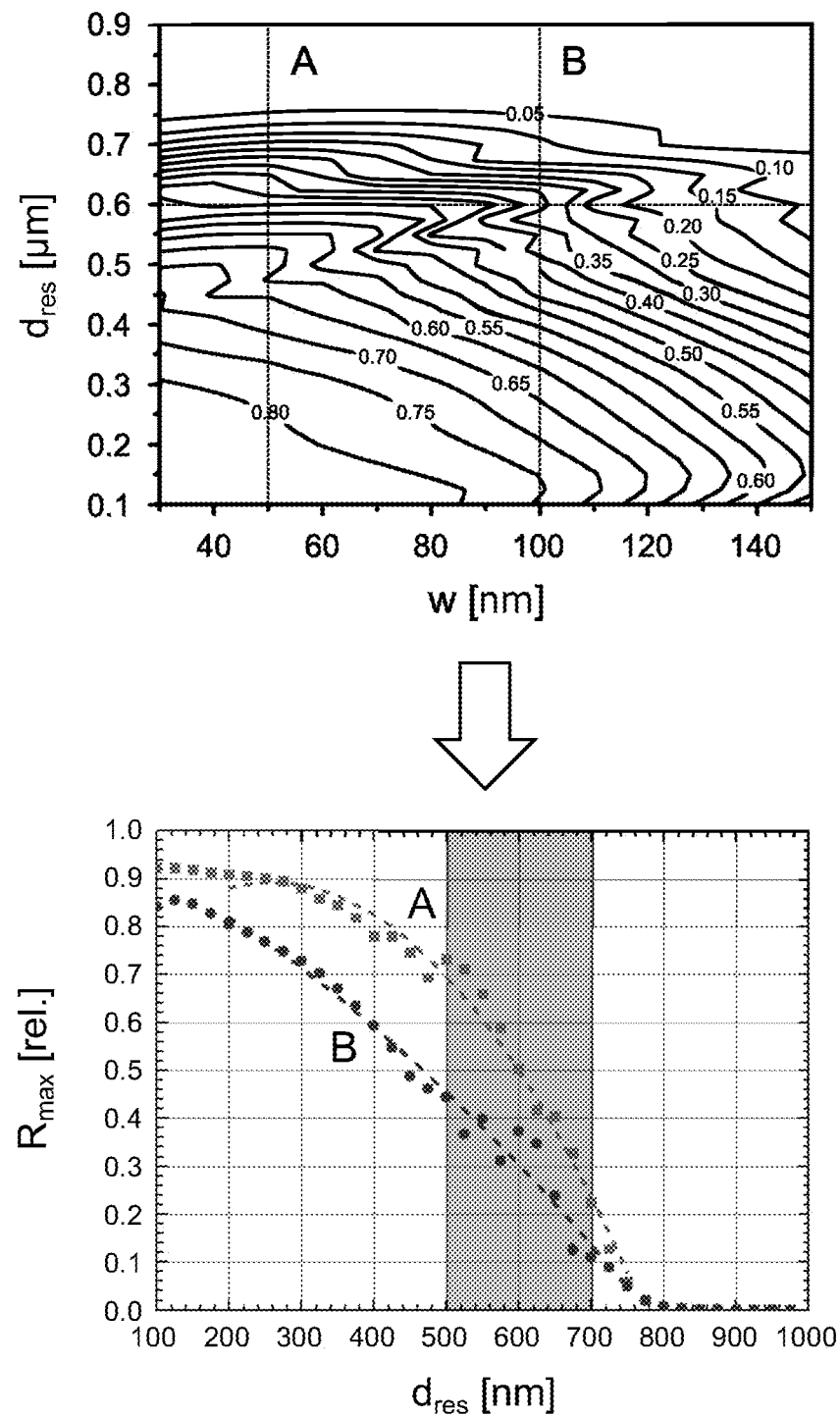
FIG. 11 a numerical simulation for determining the maximum achievable reflectance $R_{max}(d_{res}, w)$ of a grating structure as a function of the distance d of the trenches to the active layer and the minimum width w of the trenches in the vicinity of the active layer in the case of a uniform grating.

FIG. 11 shows a numerical simulation for determining the maximum achievable reflectance $R_{max}(d_{res}, w)$ of a grating structure as a function of the distance $d_{res}$ of the trenches to the active layer and the minimum width w of the trenches in the vicinity of the active layer in the case of a uniform grating. The maximum achievable reflectivities $R_{max}$ are shown as contour plot. From this, the specific course of the isolines of individual reflection values can be taken. The two perpendicular dashed lines correspond to values for a typical minimum width w of the trenches of 50 nm and 100 nm, respectively. The influence of the refractive index n of the trenches was not explicitly considered here and therefore this is assumed to be constant for all trenches. The calculation was based on a surface grating of order N=40 with a total length L=6 mm. The profile of the maximum achievable reflectance $R_{max}$ as a function of the distance $d_{res}$ of the trenches to the active layer at a corresponding fixed width w of the trenches can be taken from the sections of the vertical with the individual isolines. This process is shown in the lower part of FIG. 11. In the examples shown results in the range between 500 nm and 700 nm, a nearly linear dependence between the distance $d_{res}$ of the trenches to the active layer and the maximum achievable reflectance $R_{max}$. These two limit values define a preferred working range in the production of such a laser diode according to the invention, since due to the simple functional relationship the influence of fabrication tolerances can be estimated and easily compensated.

Figure 12:
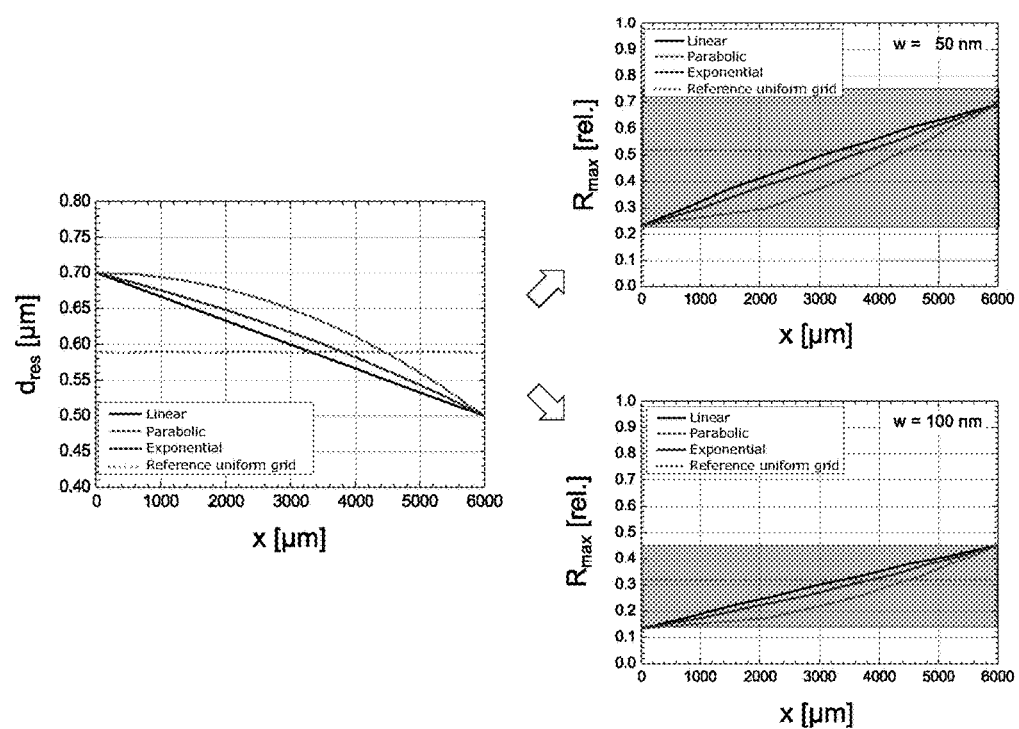
FIG. 12 a numerical simulation for determining the locally resolved maximum reflectance $R_{max}(x)$ of the grating for a plurality of embodiments of a laser diode with a variation of the grating strength according to the invention.

FIG. 12 shows a numerical simulation for determining the locally resolved maximum reflectance $R_{max}(x)$ of the grating for a plurality of embodiments of a laser diode having a variation of the effective grating strength according to the invention. The length L of the produced grating was in each case 6 mm. Shown in particular are the locally resolved course of the distance d of the trenches to the active layer as a function of the grating position x for three different grating types with linear, parabolic and exponential dependence of the reflectance on the grating position x. Furthermore, the course of the locally resolved maximum reflectance $R_{max}(x)$ for a conventional uniform grating with a fixed reflectance over the entire length L of the grating is shown as a reference. The variation of the distance d of the trenches to the active layer is preferably carried out in the linear working range between 500 nm and 700 nm determined for this parameter from FIG. 11. The dependency of the locally resolved reflectance $R_{max}(x)$ as a function of the grating position x can be determined from the parameter variation with the help of the course curves also shown in FIG. 11. It can be seen in particular that for trenches with a fixed minimum width w of 50 nm in the linear working range, the locally resolved maximum reflectance $R_{max}(x)$ varies between the rear facet and front facet of the laser diode between about 0.2 and 0.7, while for trenches with a fixed minimum width w of 100 nm under approximately the same conditions, the locally resolved maximum reflectance $R_{max}(x)$ varies between the rear facet and front facet only between values of 0.1 and 0.5. If only one of the possible grating parameters is to be varied in the design of a laser diode according to the invention, all other parameters should also be examined for their influence and taken into account accordingly. From the courses for the individual reflectivities $R_{max}(x)$, an apodization measure A for the grating can be determined. For the examined gratings, FIG. 12 shows values around 3.5 and 5, which are all greater than 1.1. The values for the coupling factor length product $\kappa_L(x)$ are obtained by conversion in a corresponding manner with the curve courses shown.

These results show that by a variation and adaptation of the coupling strength of the grating according to the invention to the optical power density within the laser diode, a significant improvement in the performance parameters can be achieved. In the present case, by apodizing the grating, an increase in the thermal stability and thermal tuning performance of the laser diode between 5 K and 10 K, in contrast to a conventional laser diode with distributed feedback through a uniform grating, could be demonstrated without significantly degrading the electro-optical power increase S.

In particular, it was possible to demonstrate laser diodes in which a variation $d_{res}$ according to the invention could be set at a distance of the individual trenches to the active layer. Here, the global maximum of the distance $d_{res}$ was 0.50 μm and the global minimum of the distance $d_{res}$ was 0.70 μm. Thus, the preferred variation of $d_{res}$ was 1.4 at the distance $d_{res}$ of the individual trenches to the active layer. The two extreme values, thereby were located on one of the outer facets of the laser diode.

It should finally be pointed out that the results shown for the laser diodes according to the invention are preliminary first test measurements on individual prototypes. In particular, no comprehensive process and parameter optimizations have been carried out so that there is definitely the possibility of a considerable further expansion of the possible locking area.

REFERENCE LIST 10 active layer
12 waveguiding region
14 rear facet
16 front facet
18 grating
22 ridges
24 trenches
26 guided wave
28 power density
30 etching mask
32 mask openings
100 laser diode
d trench depth
$d_{res}$ distance between the trench and the active layer
w trench width
n refractive index
Δn refractive index difference (also refractive index contrast)
Λ grating constant
I intensity
Δλ spectral linewidth
$Δλ_{det}$ detuning
S electro-optical power increase
R reflectance
$\kappa_L$ coupling factor length product
X first axis or direction
Y second axis or direction
P coupling parameter
A apodization measure (Apodisierungsmaßzahl)
V variation

The invention claimed is:
1. Laser diode (100) comprising:
an active layer (10);
a waveguiding region (12) at least partially surrounding the active layer (10);
a rear facet (14);
a front facet (16) designed for outcoupling laser radiation, wherein the active layer (10) extends at least partially along a first axis (X) between the rear facet (14) and the front facet (16); and
a grating (18) operatively connected to the waveguiding region (12), wherein the grating (18) comprises a plurality of ridges (22) and trenches (24), wherein the grating (18) is a surface grating with the order of the grating (18) in the range between 10 and 100,
wherein
the plurality of trenches (24) is designed such that an average increase of a coupling parameter P for the plurality of trenches (24) along the grating (18) is non-zero, wherein the coupling parameter P of a trench (24) is defined by the equation (1)

$$P = \frac{\Delta n}{w d_{res}}, \quad (1)$$

wherein $d_{res}$ is a distance of the trench (24) to the active layer (10), w is a width of the trench (24), and Δn is a refractive index difference between a refractive index of the trench (24) and a refractive index of a material surrounding the trench (24).

2. Laser diode (100) according to claim 1, wherein the grating (18) has an apodization measure $A_P$ of greater than or equal to 1.1 in relation to the coupling parameter P, wherein the apodization measure $A_P$ according to equation (2)

$$A_P = \frac{\text{Maximum}\{P\}}{\text{Minimum}\{P\}} \quad (2)$$

results from the ratio between a maximum and a minimum value for the coupling parameter P of the plurality of trenches (24) of the grating (18).

3. Laser diode (100) according to claim 1, wherein the grating (18) has an apodization measure $A_R$ of greater than or equal to 1.1 in relation to the local reflectance R(x), wherein the apodization measure $A_R$ according to equation (3)

$$A_R = \frac{\text{Maximum}\{R(x)\}}{\text{Minimum}\{R(x)\}} \quad (3)$$

results from the ratio between a maximum and a minimum value for the local reflectance R (x) of the grating (18).

4. Laser diode (100) according to claim 1, wherein the grating has a dimension value of apodization $A_{\kappa L}$ greater than or equal to 1.1 in relation to the local coupling factor length product $\kappa_L$, wherein the apodization measure $A_{\kappa L}$ according to equation (4)

$$A_{\kappa L} = \frac{\text{Maximum}\{\kappa L(x)\}}{\text{Minimum}\{\kappa L(x)\}} \quad (4)$$

results from the ratio between a maximum and a minimum value for the local coupling factor length product $\kappa_L(x)$ of the grating (18).

5. Laser diode (100) according to claim 1, wherein the coupling parameter P of the individual trenches (24) is adapted to the power density of the wave (26) guided in the waveguiding region (12), wherein the coupling parameter P is decreased in the areas of high power density compared to the coupling parameter P in the areas of low power density.

6. Laser diode (100) according to claim 1, wherein the functional relationship of the coupling parameter P along the grating (18) is arbitrary, monotonically increasing or decreasing, linearly increasing or decreasing, quadratically increasing or decreasing, or exponentially increasing or decreasing.

7. Laser diode (100) according to claim 1, wherein a variation $V_{dres}$ resulting from the ratio between a maximum and a minimum value for the distance $d_{res}$ of the individual trenches (24) to the active layer (10) according to equation (5)

$$V_{dres} = \frac{\text{Maximum}\{d_{res}\}}{\text{Minimum}\{d_{res}\}}, \quad (5)$$

is greater than or equal to 1.1.

8. Laser diode (100) according to claim 1, wherein a variation $V_w$ resulting from the ratio between a maximum and a minimum value for the width w of the individual trenches (24) according to equation (6)

$$V_w = \frac{\text{Maximum}\{w\}}{\text{Minimum}\{w\}} \quad (6)$$

is greater than or equal to 1.1.

9. Laser diode (100) according to claim 1, wherein a variation $V_{\Delta n}$ $V_{\Delta n}$ resulting from the ratio between a maximum and a minimum value for the refractive index difference $\Delta n$ between the respective refractive index of an individual trench (24) and the refractive index of the material enclosing the trench (24) according to equation (7)

$$V_{\Delta n} = \frac{\text{Maximum}\{\Delta n\}}{\text{Minimum}\{\Delta n\}} \quad (7)$$

is greater than or equal to 1.1.

10. Laser diode (100) according to claim 1, wherein the length L of the grating (18) is greater than or equal to 100 µm or corresponds to at least 10% of the distance between the rear facet (14) and the front facet (16) along the first axis (X).

11. Laser diode (100) according to claim 1, wherein the grating extends over the complete resonator length or is divided into at least two sub-gratings, wherein the at least two sub-gratings between the rear facet (14) and the front facet (16) along the first axis (X) are distributed arbitrarily.

12. Laser diode (100) according to claim 11, wherein the trenches (24) of the grating (18) are located completely or partially in areas of optical gain or no optical gain.

13. Laser diode (100) according to claim 1, wherein the plurality of trenches (24) is equidistant spaced.

14. Laser diode (100) according to claim 1, wherein at at least one of the trenches (24) a width w of the trench (24) tapers in the direction of the active layer (10).

15. Laser diode (100) according to claim 1, wherein the walls of the trenches (24) have different profiles.

16. Method for producing a laser diode (100) comprising:
providing an active layer (10) and a waveguiding region (12) at least partially surrounding the active layer (10);
forming a rear facet (14) and a front facet (16) adapted for coupling out laser radiation, wherein the active layer (10) extends at least partially along a first axis (X) between the rear facet (14) and the front facet (16); and
forming a grating (18) with a plurality of ridges (22) and trenches (24) such that the grating (18) is operatively connected to the waveguiding region (12), wherein the grating (18) is a surface grating with the order of the grating (18) in the range between 10 and 100,
wherein
the plurality of trenches (24) is designed such that at least one dimension value of apodization A for the plurality of trenches (24) is greater than or equal to 1.1.

17. Method for producing a laser diode (100) according to claim 16, further comprising:
applying an etching mask (30) with a plurality of openings (32) to the waveguiding region (12), wherein the width of the openings (32) varies locally along a first axis (X) and/or a second axis (Y); and
patterning the masked waveguiding region (12) by an etching process.

18. Method for producing a laser diode (100) according to claim 16, wherein the etching process is anisotropic reactive ion etching.

19. Laser Diode (100) comprising:
an active layer (10);
a waveguiding region (12) at least partially surrounding the active layer (10);
a rear facet (14);

a front facet (16) designed for outcoupling laser radiation, wherein the active layer (10) extends at least partially along a first axis (X) between the rear facet (14) and the front facet (16); and a grating (18) operatively connected to the waveguiding region (12), wherein the grating (18) comprises a plurality of ridges (22) and trenches (24), wherein the plurality of trenches (24) is designed such that an average increase of a coupling parameter P for the plurality of trenches (24) along the grating (18) is non-zero, wherein the coupling parameter P of a trench (24) is defined by the equation (8)

$$P = \frac{\Delta n}{w d_{res}} \quad (8)$$

wherein $d_{res}$ is a distance of the trench (24) to the active layer (10), w is a width of the trench (24), and $\Delta n$ is a refractive index difference between a refractive index of the trench (24) and a refractive index of a material surrounding the trench (24), wherein the variation of the grating strength along the longitudinal axis is a quadratic increase, and wherein the grating (18) has an apodization measure A of greater than or equal to 3 in relation to the local reflectance R(x) or the local coupling factor length product $\kappa_L(x)$, wherein the apodization measure A according to equations (9) and (10)

$$A_R = \frac{\text{Maximum}\{R(x)\}}{\text{Minimum}\{R(x)\}} \quad (9)$$

$$A_{\kappa L} = \frac{\text{Maximum}\{\kappa L(x)\}}{\text{Minimum}\{\kappa L(x)\}} \quad (10)$$

results from the ratio between a maximum and a minimum value for the local reflectance R(x) of the grating (18) or from the ratio between a maximum and a minimum value for the local coupling factor length product $\kappa_L(x)$ of the grating (18), respectively.

20. Laser diode (100) comprising:
an active layer (10);
a waveguiding region (12) at least partially surrounding the active layer (10);
a rear facet (14);
a front facet (16) designed for outcoupling laser radiation, wherein the active layer (10) extends at least partially along a first axis (X) between the rear facet (14) and the front facet (16); and
a grating (18) operatively connected to the waveguiding region (12), wherein the grating (18) comprises a plurality of ridges (22) and trenches (24), wherein the plurality of trenches (24) is designed such that an average increase of a coupling parameter P for the plurality of trenches (24) along the grating (18) is non-zero, wherein the coupling parameter P of a trench (24) is defined by the equation (11)

$$P = \frac{\Delta n}{w d_{res}} \quad (11)$$

wherein $d_{res}$ is a distance of the trench (24) to the active layer (10), w is a width of the trench (24), and $\Delta n$ is a refractive index difference between a refractive index of the trench (24) and a refractive index of a material surrounding the trench (24), wherein the coupling parameter P of the individual trenches (24) along a second axis (Y) extending perpendicular to the first axis (X) is location-dependent and the location-dependent coupling parameter P of a trench (24) is adapted to the power density of the wave (26) guided in the waveguiding region (12), and wherein the value of the location-dependent coupling parameter P of the trench (24) is decreased in the areas of high power density compared to the value of the location-dependent coupling parameter P of the trench (24) in the areas of low power density.

* * * * *